United States Patent
Wang et al.

(10) Patent No.: US 11,327,353 B2
(45) Date of Patent: May 10, 2022

(54) DISPLAY PANEL, MANUFACTURING METHOD THEREOF AND DISPLAY DEVICE

(71) Applicant: BOE Technology Group Co., Ltd., Beijing (CN)

(72) Inventors: Jingquan Wang, Beijing (CN); Hongli Wang, Beijing (CN); Li Tian, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 66 days.

(21) Appl. No.: 16/766,969

(22) PCT Filed: Jan. 20, 2020

(86) PCT No.: PCT/CN2020/073279
§ 371 (c)(1),
(2) Date: May 26, 2020

(87) PCT Pub. No.: WO2020/173261
PCT Pub. Date: Sep. 3, 2020

(65) Prior Publication Data
US 2021/0200009 A1     Jul. 1, 2021

(30) Foreign Application Priority Data
Feb. 26, 2019   (CN) .......................... 201910142304.4

(51) Int. Cl.
*G02F 1/1333*     (2006.01)
*G02F 1/1335*     (2006.01)
(Continued)

(52) U.S. Cl.
CPC ........ *G02F 1/13338* (2013.01); *G02F 1/1333* (2013.01); *G02F 1/133526* (2013.01);
(Continued)

(58) Field of Classification Search
CPC ...... G02F 1/1333; G02F 1/294; H04N 5/2257
See application file for complete search history.

(56) References Cited

U.S. PATENT DOCUMENTS 8,421,990 B2    4/2013  Biring
10,678,089 B2   6/2020  Li et al.
(Continued)

FOREIGN PATENT DOCUMENTS

CN     102759837 A     10/2012
CN     205787510 U     12/2016
(Continued)

OTHER PUBLICATIONS

Mar. 27, 2020—(CN) First Office Action Appn 201910142304.4 with English Translation.

*Primary Examiner* — Jessica M Merlin
(74) *Attorney, Agent, or Firm* — Banner & Witcoff, Ltd.

(57) ABSTRACT

A display panel, a manufacturing method thereof and a display device are provided. The display panel includes a display substrate and an opposing substrate arranged opposite to each other, a liquid crystal layer and a liquid crystal control electrode, the display substrate includes a display region and a first region disposed in the display region, the display substrate is provided with a recessed portion in the first region on a side facing the opposing substrate, the liquid crystal layer is accommodated into the recessed portion and disposed between the display substrate and the opposing substrate and the liquid crystal control electrode is configured to allow the liquid crystal layer to form as a liquid crystal lens after applied with voltage.

19 Claims, 5 Drawing Sheets

(51) Int. Cl.
*G02F 1/1343* (2006.01)
*G02F 1/29* (2006.01)
*H04N 5/225* (2006.01)
*H01L 27/32* (2006.01)

(52) U.S. Cl.
CPC ........ *G02F 1/134309* (2013.01); *G02F 1/294* (2021.01); *H01L 27/323* (2013.01); *H04N 5/2257* (2013.01)

(56) References Cited

U.S. PATENT DOCUMENTS

| | | | |
|---|---|---|---|
| 2001/0055145 A1* | 12/2001 | Hamada | G02B 3/14 359/290 |
| 2011/0025955 A1* | 2/2011 | Bos | G02F 1/1345 349/95 |
| 2016/0274423 A1 | 9/2016 | Kashiwagi et al. | |
| 2017/0287992 A1 | 10/2017 | Kwak et al. | |
| 2020/0033524 A1 | 1/2020 | Gao et al. | |

FOREIGN PATENT DOCUMENTS

| | | | |
|---|---|---|---|
| CN | 106950738 A | | 7/2017 |
| CN | 107241465 A | | 10/2017 |
| CN | 108508636 A | | 9/2018 |
| CN | 108957754 A | | 12/2018 |
| CN | 109239997 A | * | 1/2019 |
| CN | 109239997 A | | 1/2019 |
| CN | 109656049 A | | 4/2019 |
| JP | 2014103458 A | | 6/2014 |

* cited by examiner

DISPLAY PANEL, MANUFACTURING METHOD THEREOF AND DISPLAY DEVICE

The application is a U.S. National Phase Entry of International Application No. PCT/CN2020/073279 filed on Jan. 20, 2020, designating the United States of America and claiming priority to Chinese Patent Application No. 201910142304.4, filed Feb. 26, 2019. The present application claims priority to and the benefit of the above-identified applications and the above-identified applications are incorporated by reference herein in their entirety.

TECHNICAL FIELD

At least one embodiment of the present disclosure relates to a display panel, a manufacturing method thereof and a display device.

BACKGROUND

With the development and progress of society, the application of electronic display products is becoming more and more extensive, and users' requirements on the display effect of the electronic display products are becoming higher and higher. Current electronic display products are usually equipped with camera devices to have more auxiliary functions. However, as for the current technology, it is necessary to arrange a camera device in the electronic display product. The camera device is generally arranged in a frame region at a periphery of a display region, which makes the design size of the electronic display product larger, and makes it difficult to realize narrow frame design.

SUMMARY

At least one embodiment of the present disclosure provides a display panel, the display panel comprises a display substrate and an opposing substrate arranged opposite to each other, a liquid crystal layer and a liquid crystal control electrode, the display substrate includes a display region and a first region disposed in the display region, the display substrate is provided with a recessed portion in the first region on a side facing the opposing substrate, the liquid crystal layer is accommodated into the recessed portion and disposed between the display substrate and the opposing substrate, and the liquid crystal control electrode is configured to allow the liquid crystal layer to form as a liquid crystal lens after applied with voltage.

For example, in the display panel provided by at least one embodiment of the present disclosure, the liquid crystal control electrode includes a first electrode disposed on the display substrate and a second electrode disposed on the opposing substrate; and the first electrode and the second electrode are overlapped with the liquid crystal layer in a direction perpendicular to the display panel.

For example, in the display panel provided by at least one embodiment of the present disclosure, the first electrode includes a plurality of annular first sub-electrodes, the second electrode includes a plurality of annular second sub-electrodes, and the plurality of first sub-electrodes are disposed to be spaced away from each other and the plurality of second sub-electrodes are disposed to be spaced away from each other along a radial direction of the liquid crystal layer.

For example, in the display panel provided by at least one embodiment of the present disclosure, one of the first electrode and the second electrode is set to include a plurality of annular sub-electrodes, and the plurality of sub-electrodes are disposed to be spaced away from each other along a radial direction of the liquid crystal layer; and the other one of the first electrode and the second electrode is set to be a planar electrode.

For example, in the display panel provided by at least one embodiment of the present disclosure, the display substrate includes a display array layer in the display region on a side facing the opposing substrate, the display array layer includes a plurality of conductive layers, and the first electrode is arranged in a same layer with one of the plurality of conductive layers.

For example, in the display panel provided by at least one embodiment of the present disclosure, the display array layer is arranged around the recessed portion, and the first electrode is insulated from the plurality of conductive layers of the display array layer.

For example, in the display panel provided by at least one embodiment of the present disclosure, the display array layer includes a driving circuit layer and a light-emitting element layer disposed on the driving circuit layer, the driving circuit layer is configured to control a light-emitting element of the light-emitting element layer to emit light, the light-emitting element layer includes an anode layer, a light-emitting functional layer and a cathode layer which are laminated to each other; and the first electrode is arranged in a same layer with one of the anode layer and the cathode layer.

For example, in the display panel provided by at least one embodiment of the present disclosure, the display array layer is arranged around the recessed portion, and the first electrode is insulated from the anode layer and the cathode layer.

For example, in the display panel provided by at least one embodiment of the present disclosure, the opposing substrate is set to be a touch substrate.

For example, in the display panel provided by at least one embodiment of the present disclosure, the touch substrate includes a touch electrode layer disposed in the display region outside the first region, the touch electrode layer includes a plurality of driving electrodes and a plurality of sensing electrodes, the plurality of driving electrodes and the plurality of sensing electrodes are intersected with each other, and the second electrode is arranged in a same layer with at least one of the driving electrode or the sensing electrode.

For example, in the display panel provided by at least one embodiment of the present disclosure, the display substrate also includes a packaging layer covering the display region and the first region, and the liquid crystal layer is disposed between the packaging layer and the opposing substrate.

For example, in the display panel provided by at least one embodiment of the present disclosure, the packaging layer includes at least one inorganic packaging layer and an organic packaging layer laminated to each other, the organic packaging layer covers the display region and is not disposed in the first region, and the at least one inorganic packaging layer covers the display region and the first region.

For example, in the display panel provided by at least one embodiment of the present disclosure, the at least one inorganic packaging layer covers a side wall and a bottom of the recessed portion, so as to surround the liquid crystal layer.

For example, in the display panel provided by at least one embodiment of the present disclosure, the packaging layer includes two inorganic packaging layers and one organic packaging layer laminated to each other, the organic packaging layer is disposed between the two inorganic packaging layers, the organic packaging layer covers the display region and is not disposed in the first region, the two inorganic packaging layer covers the display region, and at least one of the two inorganic packaging layers covers the first region.

For example, in the display panel provided by at least one embodiment of the present disclosure, the display substrate includes a first base substrate, and the first base substrate includes a first groove in the first region on a surface facing the opposing substrate; and/or the opposing substrate includes a second base substrate, and the second base substrate includes a second groove in the first region on a surface facing the display substrate, in which the first groove and the second groove correspond to the recessed portion.

At least one embodiment of the present disclosure provides a display device, the display device comprises the display panel according to any one of the above embodiments.

For example, the display panel provided by at least one embodiment of the present disclosure further comprises an image capture element disposed on a side of the display panel opposite to a display side, the image capture element is overlapped with the first region of the display substrate in a direction perpendicular to the display panel, so as to receive ambient light incident through the first region of the display substrate.

For example, in the display panel provided by at least one embodiment of the present disclosure, the image capture element includes a first lens.

For example, in the display panel provided by at least one embodiment of the present disclosure, the image capture element also includes a second lens, the first lens is disposed between the second lens and the display substrate, and the first lens is configured to be a concave lens, and the second lens is configured to be a convex lens.

At least one embodiment of the present disclosure provides a method for manufacturing a display panel, the display panel is the display panel according to any one of claims 1 to 15, and the manufacturing method comprises: providing a display substrate, in which the display substrate includes a display region and a first region disposed in the display region, the display substrate is provided with a recessed portion disposed in the first region; injecting a liquid crystal material into the recessed portion; providing an opposing substrate and cell-assembling the opposing substrate and the display substrate so that the liquid crystal material is formed into a liquid crystal layer; and forming a liquid crystal control electrode on at least one of the display substrate or the opposing substrate, in which the liquid crystal control electrode is configured to allow the liquid crystal layer to form a liquid crystal lens after applied with voltage.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

Figure 1:
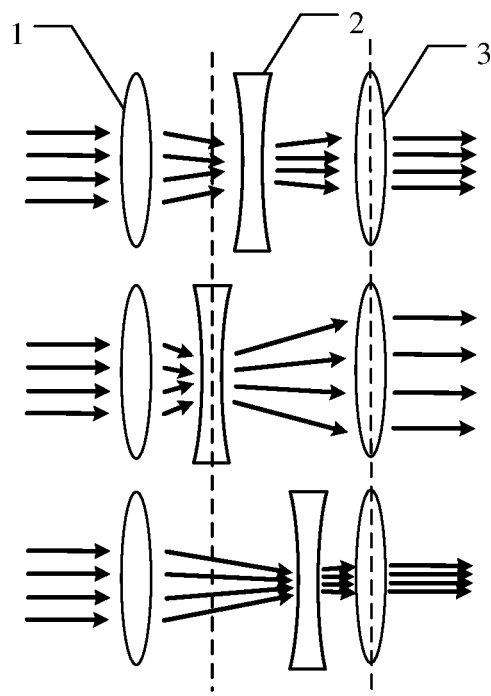
FIG. 1 is a schematic structural view of a zoom component of a camera.

An electronic device with display function (a display device such as a mobile phone, a notebook computer, etc.) may be equipped with a camera to have shooting function, and a zoom component may be arranged in the camera to adjust the focal length. As shown in FIG. 1, along an optical path of light entering the camera from the outside (see arrows in the figure), the zoom component of the camera may include a convex lens 1, a concave lens 2 and a convex lens 3 which are arranged in sequence. The imaging focal length of the zoom component can be adjusted by adjusting a position of the concave lens 2 in the optical path between the convex lens 1 and the convex lens 3. In order to achieve a sufficient zoom factor, the concave lens 2 must have enough moving space, that is, the design thickness of the zoom component and even the camera is large.

When a display device includes a camera, if the camera is arranged under the screen, that is, the entire camera is disposed on the back of a display panel, and an opening is formed in the front of the display panel to allow ambient light to enter for shooting, because the design thickness of the camera is large, the thickness of the entire display device is relatively large, and the display panel needs to be designed to transmit light in a region corresponding to the camera, resulting in different structural designs of the region and other regions of the display panel, making the brightness and the contrast of display images in the two regions different, consequently resulting in poor display. If an opening is formed in the display panel, so that at least portion of the camera is placed in the opening, the design thickness of the entire display device may be reduced, but the process of forming the opening in the display panel is very complicated, so the packaging effect of the display panel after the opening is forming is deteriorated, causing moisture, impurities and the like to easily enter the interior of the display panel, resulting in aging, deterioration and the like of the display device, consequently resulting in poor display.

At least one embodiment of the present disclosure provides a display panel, which comprises a display substrate and an opposing substrate which are arranged opposite to each other, a liquid crystal layer and a liquid crystal control electrode. The display substrate includes a display region and a first region and is provided with a recessed portion in the first region on a side facing the opposing substrate; the liquid crystal layer is accommodated into the recessed portion and disposed between the display substrate and the opposing substrate; and the liquid crystal control electrode is configured to allow the liquid crystal layer to form a liquid crystal lens after applied with voltage. For instance, in some embodiments, the first region is disposed in the display region. Thus, the liquid crystal lens formed by using the liquid crystal layer is taken as an optical lens, so the optical lens may be disposed in the display panel without forming an opening on the display panel, and then the packaging and display effects of the display panel can be guaranteed. In addition, after an image capture element is mounted subsequently, the optical lens may act as a zoom component of the image camera element or be taken as one lens in the zoom component. Therefore, the structure of the image capture element can be simplified, thereby facilitating the thinning of the display device comprising the display panel and the image capture element.

Description will be given below to the display panel and the display device provided by at least one embodiment of the present disclosure with reference to the accompanying drawings.

Figure 2A:
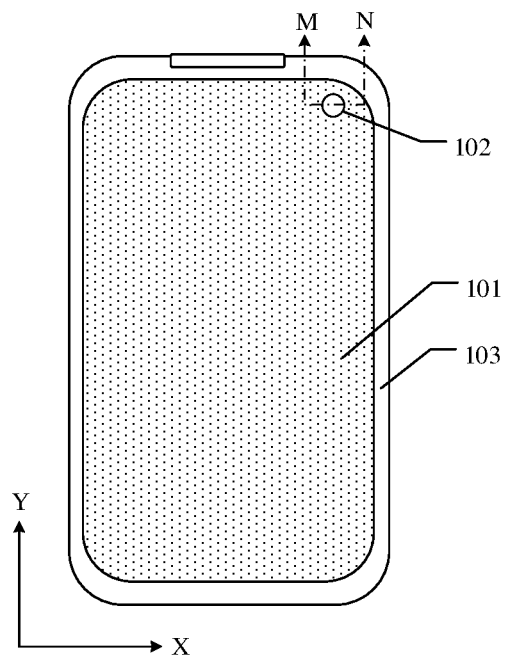
FIG. 2A is a plan view of a display panel provided by some embodiments of the present disclosure.
Figure 2B:
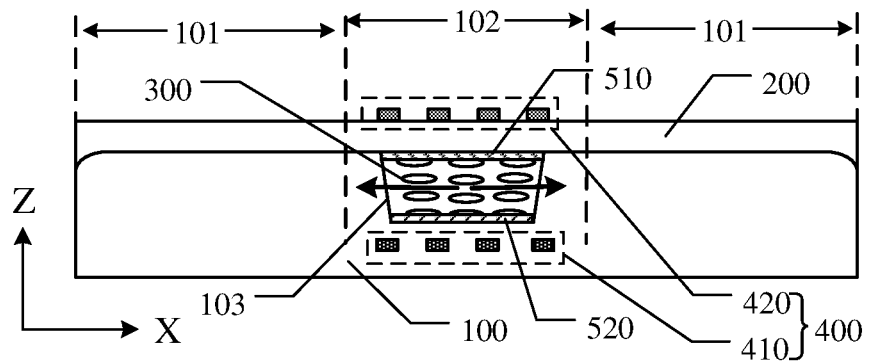
FIG. 2B is a sectional view of the display panel as shown in FIG. 2A along M-N.

FIG. 2A is a plan view of a display panel provided by some embodiments of the present disclosure. FIG. 2B is a cross-sectional view of the display panel as shown in FIG. 2A along M-N. In the display panel provided by at least one embodiment of the present disclosure, as shown in FIGS. 2A and 2B, the display panel comprises a display substrate 100 and an opposing substrate 200 which are arranged opposite to each other, a liquid crystal layer 300 and a liquid crystal control electrode 400. The display substrate 100 includes a display region 101 and a first region 102 disposed in the display region 101. The display substrate 100 also includes a peripheral region 103 surrounding the display region 101. The peripheral region 103 is used for arranging lead wires, providing a bonding region, sealing, etc. The first region 102 is disposed in the display region 101, for example, is encircled by the display region 101. The display substrate 100 is provided with a recessed portion 103 in the first region 102 on a side facing the opposing substrate 200. The liquid crystal layer 300 is accommodated into the recessed portion 103 and then is disposed between the display substrate 100 and the opposing substrate 200. The liquid crystal control electrode 400 may form an electric field after applied with voltage. Liquid crystal molecules in the liquid crystal layer are deflected under the action of the electric field to change the refractive index distribution in the liquid crystal layer, whereby the liquid crystal layer can be formed into a liquid crystal lens under the action of the electric field, and can converge or diverge light passing through the liquid crystal layer. An image capture element is disposed in a region corresponding to the first region 102 on the back of the display substrate, so an in-screen imaging display device can be realized, and the peripheral region 103 can be narrower to achieve narrow frame design. Material layers (such as an insulating layer, a packaging layer and the like that will be described below) at least corresponding to the recessed portion in the first region 102 are transparent materials, so ambient light can be transmitted through.

In at least one embodiment of the present disclosure, a size of the liquid crystal layer of the display panel may be designed according to the specification requirement of the subsequently mounted image capture element. For instance, in a direction parallel to the plane where the display panel is positioned, a planar shape of the liquid crystal layer is circular, and a diameter of the liquid crystal layer is 1 mm to 4 mm, for example, may be 2 mm, 2.5 mm, 3 mm, etc. For instance, in a direction perpendicular to the plane where the display panel is positioned, a thickness of the liquid crystal layer is not less than 10 µm.

Figure 5:
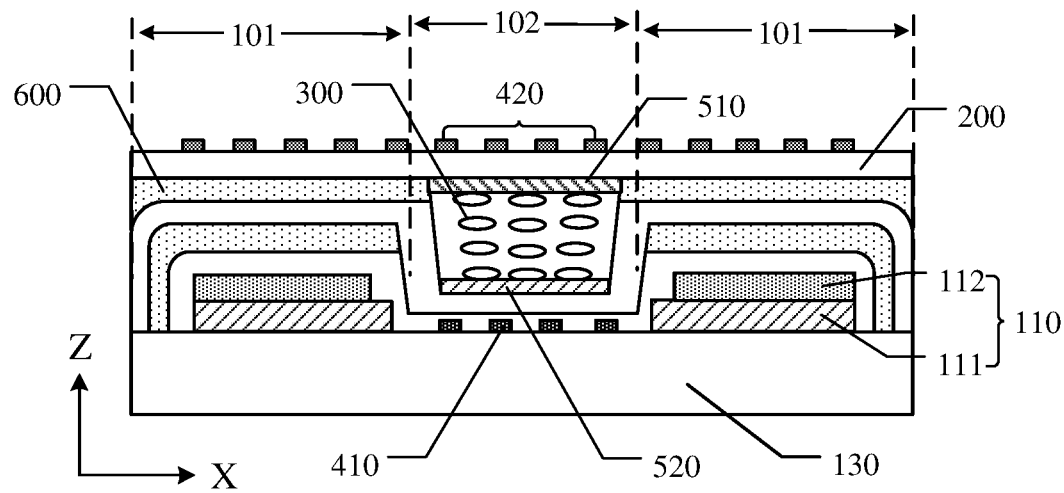
FIG. 5 is a sectional view of another display panel provided by some embodiments of the present disclosure.

For instance, the display panel further comprises an alignment layer disposed on at least one side of the liquid crystal layer for the pre-alignment of liquid crystal molecules of the liquid crystal layer. Illustratively, as shown in FIG. 2B, a first alignment layer 510 is disposed on a surface of the opposing substrate 200 that is disposed in the first region and faces the display substrate, and a second alignment layer 520 is disposed on a bottom surface of the recessed portion 103 of the display substrate. For instance, the first alignment layer 510 and the second alignment layer 520, for example, may obtain alignment ability by rubbing or optical-alignment treatment. For instance, materials of the first alignment layer 510 and the second alignment layer 520 include polyimide (PI). For instance, the first alignment layer 510 and the second alignment layer 520 have the same alignment direction and then can suppress the backflow effect under the action of the electric field and shorten the response time of the liquid crystal layer during forming the liquid crystal lens and adjusting the focal length of the liquid crystal lens. For instance, the second alignment layer 520 may be disposed on a surface of a packaging layer (such as an inorganic packaging layer) of the display substrate, and more details are as shown in FIG. 5.

For instance, in the display panel provided by at least one embodiment of the present disclosure, the liquid crystal control electrode includes a first electrode disposed on the display substrate and a second electrode disposed on the opposing substrate, and the first electrode and the second electrode are overlapped with the liquid crystal layer in a direction perpendicular to the display panel. Illustratively, as shown in FIG. 2B, a first electrode 410 of the liquid crystal control electrode 400 is disposed on the display substrate 100; a second electrode 420 of the liquid crystal control electrode 400 is disposed on the second substrate 200; and orthographic projections of the first electrode 410, the second electrode 420 and the liquid crystal layer 300 on the opposing substrate 200 coincide with each other. For instance, after the first electrode 410 and the second electrode 420 are applied with different voltages, the first electrode 410 and the second electrode 420 can generate vertical electric field; the liquid crystal layer 300 is in the electric field; and the intensity and distribution of the electric field can be changed by adjusting the voltage value and distribution on the first electrode 410 and the second electrode 420, and then the refractive index and distribution of the liquid crystal layer 300 can be adjusted.

The refractive index and distribution of liquid crystals are related to the electric field strength and distribution of the electric field where the liquid crystals are located. Therefore, the electric field whose electric field strength changes along a radial direction of the liquid crystal layer can be formed by controlling the liquid crystal control electrode, which can make the refractive index of the liquid crystal layer change along the radial direction, so that the liquid crystal layer is formed into a liquid crystal lens. For example, after the liquid crystal layer is formed into the liquid crystal lens, if the refractive index of the liquid crystal layer becomes larger from the inside to the outside along the radial direction of the liquid crystal layer, the liquid crystal lens has light-dispersing effect and may have the optical function of a concave lens (in the following embodiments, the liquid crystal lens is a concave lens in short); if the refractive index of the liquid crystal layer becomes small, the liquid crystal lens has light-converging effect and is equivalent to a convex lens.

The distribution of the electric field generated by the control electrode is related to the structure and distribution of the control electrode. The structure of the control electrode will be described below through several embodiments.

Figure 2C:
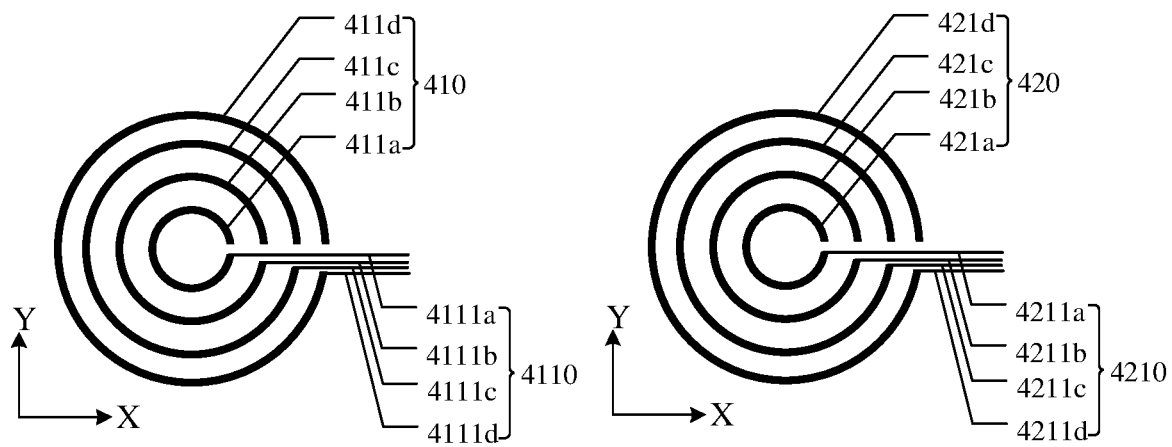
FIG. 2C is a plan view of a first electrode and a second electrode in the display panel as shown in FIG. 2B.

For instance, in the display panel provided by some embodiments of the present disclosure, the first electrode includes a plurality of annular first sub-electrodes; the second electrode includes a plurality of annular second sub-electrodes; and the plurality of first sub-electrodes are disposed to be spaced away from each other and the plurality of second sub-electrodes are disposed to be spaced away from each other along a radial direction of the liquid crystal layer. For instance, the first sub-electrodes and the second sub-electrodes are in one-to-one correspondence relationship. For instance, orthographic projections of the first sub-electrode and the second sub-electrode which correspond to each other coincide. Illustratively, as shown in FIGS. 2B and 2C, the first electrode 410 includes a plurality of first sub-electrodes 411a, 411b, 411c and 411d; the first sub-electrodes 411a, 411b, 411c and 411d are in concentric annular arrangement; the second electrode 420 includes a plurality of second sub-electrodes 421a, 421b, 421c and 421d which correspond to the first sub-electrodes 411a, 411b, 411c and 411d in sequence; and the second sub-electrodes 421a, 421b, 421c and 421d are in concentric annular arrangement. For instance, voltages applied to the first sub-electrodes 411a, 411b, 411c and 411d are different from each other; the voltage differences between the first sub-electrode 411a and the second sub-electrode 421a, between the first sub-electrode 411b and the second sub-electrode 421b, between the first sub-electrode 411c and the second sub-electrode 421c, and between the first sub-electrode 411d and the second sub-electrode 421d increase or decrease in sequence, so that the electric field, in which the electric field intensity increases or decreases in sequence from the inside to the outside along the radial direction of the liquid crystal layer (for example, the directions indicated by arrows "←" and "→" in FIG. 2B), can be formed, and then the liquid crystal lens formed by the liquid crystal layer is equivalent to a concave lens or a convex lens.

For instance, in some embodiments, the first sub-electrode and the second sub-electrode may be set to be an unclosed ring as shown in FIG. 2C. In this way, signal lines configured to apply voltages to the first sub-electrodes and the second sub-electrodes may respectively form integral structures with the corresponding first sub-electrodes and the corresponding second sub-electrodes, that is, the first sub-electrode, the second sub-electrode and the corresponding signal lines may be formed by the same conductive material through the patterning process, so the manufacturing process of the display panel can be simplified. Illustratively, as shown in FIG. 2C, the first electrode 410 is connected with a first signal line 4110, and the second electrode 420 is connected with a second signal line 4210. When the first electrode 410 includes the plurality of first sub-electrodes 411a, 411b, 411c and 411d, the first signal line 4110 includes first sub-signal lines 4111a, 4111b, 4111c and 4111d which are respectively connected with the first sub-electrodes 411a, 411b, 411c and 411d. When the second electrode 420 includes the plurality of second sub-electrodes 421a, 421b, 421c and 421d, the second signal line 4210 includes second sub-signal lines 4211a, 4211b, 4211c and 4211d which are respectively connected with the second sub-electrodes 421a, 421b, 421c and 421d. The first electrode 410 and the first signal line 4110 are an integral structure, and the second electrode 420 and the second signal line 4210 are an integral structure.

For instance, in some other embodiments, the first sub-electrode may be set to be a closed ring; the signal line configured to apply voltage to the first sub-electrode is arranged in a different layer with a layer where the first sub-electrode is located; and an insulating layer is disposed between the first sub-electrode and the signal line and provided with a through hole so as to connect corresponding first sub-electrode and signal line. For instance, a setting mode of the second sub-electrodes may refer to a setting mode of the first sub-electrodes in the above embodiment, and no further description will be given here.

For instance, in at least one embodiment of the present disclosure, the signal lines configured to apply voltages to the first sub-electrode and the second sub-electrodes may be electrically connected with a liquid crystal lens driving circuit (such as an IC chip), and the liquid crystal lens driving circuit applies voltage to the first sub-electrode and the second sub-electrode according to control signals received from a system control device (such as a CPU), so as to obtain the liquid crystal lens with required optical properties.

Figure 2D:
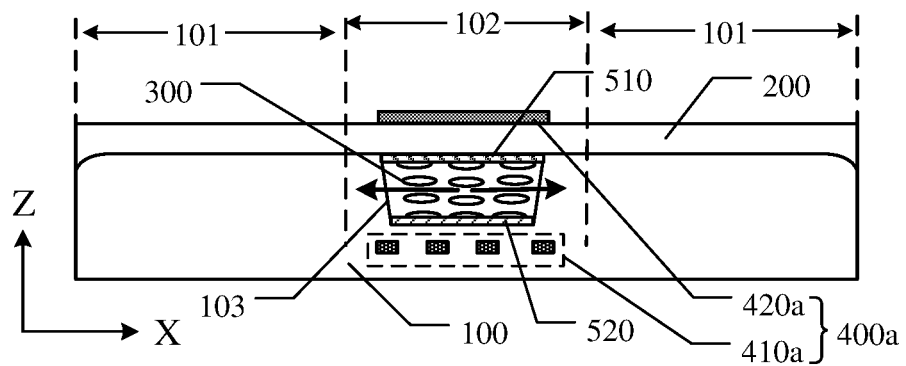
FIG. 2D is a sectional view of the display panel as shown in FIG. 2A along M-N.
Figure 2E:
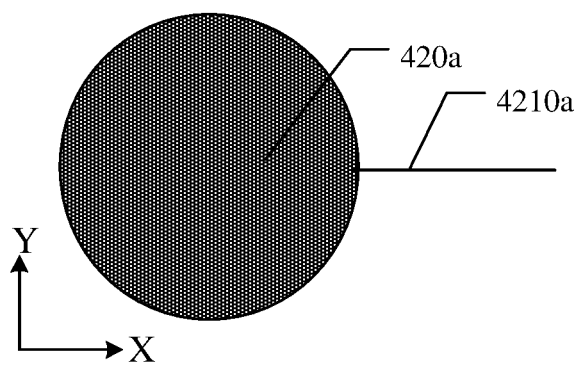
FIG. 2E is a plan view of a second electrode in the display panel as shown in FIG. 2D.

For instance, in the display panel provided by some other embodiments of the present disclosure, one of the first electrode and the second electrode is set to include a plurality of annular sub-electrodes; the plurality of sub-electrodes are arranged to be spaced apart from each other along the radial direction of the liquid crystal layer; and the other one of the first electrode and the second electrode is set to be a planar electrode. For instance, the planar shape of the planar electrode is circular. For instance, the first electrode is set to include a plurality of annular sub-electrodes, and the second electrode is set to be a planar electrode so as to be taken as a common electrode. For instance, projections of the plurality of annular sub-electrodes of the first electrode on a plane where the planar electrode of the second electrode is located fall within the planar electrode. Illustratively, as shown in FIGS. 2D and 2E, a first electrode 410a includes a plurality of sub-electrodes, and a second electrode 420a is set to be a circular planar electrode. The structure of the first electrode 410a may refer to the first electrode 410 as shown in FIG. 2C. Thus, when a liquid crystal control electrode 400a is applied with voltage, voltages applied to the sub-electrodes which are sequentially arranged from inside to outside along the radial direction of the liquid crystal layer 300 (such as the directions indicated by the arrows "←" and "→" in FIG. 2D) increase or decrease in order, so the electric field, in which the electric field intensity increases or decreases in order from inside to outside along the radial direction of the liquid crystal layer 300, can be formed, and then the liquid crystal lens formed by the liquid crystal layer 300 is equivalent to be a concave lens or a convex lens.

For instance, in some embodiments of the present disclosure, when one of the first electrode and the second electrode is set to be a planar electrode, the signal line configured to apply voltage to the planar electrode may form an integral structure with the planar electrode, that is, the planar electrode and the corresponding signal line may be formed by the same conductive material layer through the patterning process, so the manufacturing process of the display panel can be simplified. Illustratively, as shown in FIG. 2E, a second electrode 420a of the liquid crystal control electrode is a planar electrode, and a second signal line 4210a and the second electrode 420a are an integral structure. For instance, in some other embodiments of the present disclosure, when one of the first electrode and the second electrode is set to be a planar electrode, the signal line configured to apply voltage to the planar electrode is arranged in a different layer with a layer where the planar electrode is located; and an insulating layer is disposed between the planar electrode and the signal line and provided with a through hole so as to electrically connect the planar electrode and the signal line. For instance, when one of the first electrode and the second electrode is set to include a plurality of annular sub-electrodes, the setting mode of the sub-electrodes may refer to relevant description on the first sub-electrode or the second sub-electrode in FIG. 2C and the above embodiment, and no further description will be given here.

Figure 3:
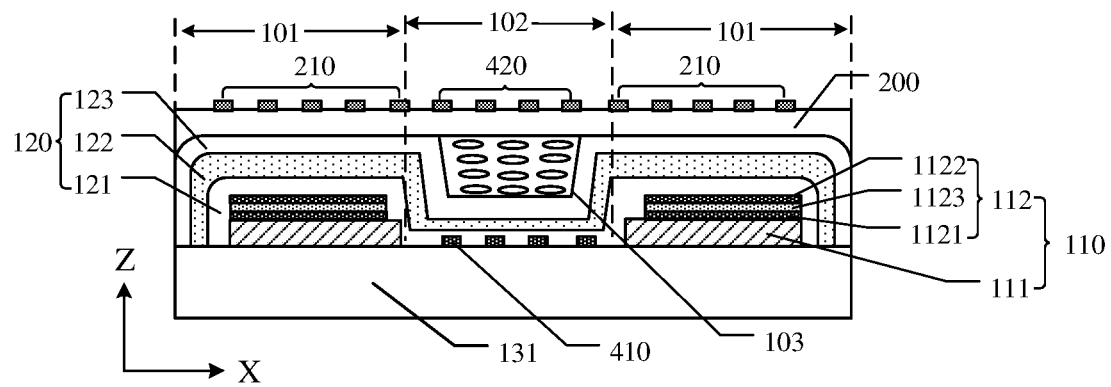
FIG. 3 is a sectional view of another display panel provided by some embodiments of the present disclosure.

For instance, in the display panel provided by at least one embodiment of the present disclosure, the display substrate includes a display array layer in the display region on a side facing the opposing substrate. Illustratively, as shown in FIG. 3, the display array layer 110 is disposed in the display region 101 at outside of the first region 102, so the first region 102 of the display substrate may form the recessed portion 103.

For instance, the display region is arranged around the first region, and a spacer layer is disposed between the display region and the recessed portion.

For instance, in at least one embodiment of the present disclosure, the display array layer includes a plurality of conductive layers, and the first electrode and one of the plurality of conductive layer are arranged in the same layer. Thus, the arrangement of the first electrode of the liquid crystal control electrode will not increase steps of manufacturing process of the display substrate, simplify the manufacturing process, and reduce the cost.

For instance, the display array layer is arranged around the recessed portion, and the first electrode and the plurality of conductive layers of the display array layer are insulated from each other.

For instance, in the display panel provided by at least one embodiment of the present disclosure, the display array layer includes a driving circuit layer and a light-emitting element layer disposed on the driving circuit layer; the driving circuit layer is configured to control a light-emitting element of the light-emitting element layer to emit light; and the light-emitting element layer includes an anode layer, a light-emitting functional layer and a cathode layer which are laminated with each other.

For instance, the display region of the display substrate includes a plurality of gate lines and a plurality of data lines; the gate lines and the data lines are intersected with each other to define a plurality of subpixel regions arranged in an array; and each subpixel region includes a pixel driving circuit and a light-emitting element. The display substrate further includes a power line, etc. For instance, the pixel driving circuit includes a plurality of transistors, a capacitor, a light-emitting element and the like, for example, formed into a plurality of forms such as 2T1C (namely 2 transistors (T) and one capacitor (C)), 3T1C or 7T1C. The pixel driving circuit is configured to control the light-emitting element to emit light according to a scanning signal applied by the gate line, a display data signal applied by the data line, and a power supply voltage provided by the power line, so as to realize image display. The gate line, the data line, the pixel driving circuit and the like are formed in the display array layer and manufactured through semiconductor process, so the display array layer includes a plurality of conductive layers (such as a wiring layer, an electrode layer, etc.) and a plurality of interlayer insulating layers (namely disposed between the conductive layers). The structure, composition and the like of the subpixel region and the pixel driving circuit thereof are not limited in the embodiment of the present disclosure.

Illustratively, as shown in FIG. 3, the display substrate includes a display array layer 110 which includes a driving circuit layer 111 and a light-emitting element layer 112; and the light-emitting element layer 112 includes an anode layer 1121, a light-emitting functional layer 1123 and a cathode layer 1122 which are sequentially laminated to each other on the display array layer 110. For instance, the light-emitting functional layer 1123 may include a hole injection layer (HIL), a hole transport layer (HTL), an organic light-emitting layer, an electron transport layer (ETL), an electron injection layer and the like from the anode layer 1121 to the cathode layer 1122. For instance, in some embodiments of the present disclosure, the light-emitting functional layer 1123 may also include an electron blocking layer (EBL), a hole blocking layer (HBL), etc.

For instance, the display region of the display substrate includes a plurality of subpixel regions, and the light-emitting element layer 112 includes a plurality of light-emitting elements in one-to-one correspondence with the subpixel regions. For instance, the anode layer includes a plurality of sub-electrodes arranged in an array; the sub-electrodes are pixel electrodes and are electrically connected with corresponding pixel driving circuits; and each sub-electrode is taken as an anode of one light-emitting element. For instance, in some embodiments, the light-emitting functional layer may be an integral film layer, that is, a plurality of organic light-emitting elements share one light-emitting functional layer, so that the plurality of organic light-emitting elements emit light of the same color (such as white light, red light, green light, blue light, etc.). For instance, in some other embodiments, the light-emitting functional layer includes a plurality of sub-light-emitting functional layers which are arranged in an array on the plurality of organic light-emitting elements, so that the organic light-emitting elements can emit light of different colors such as red light, green light, blue light, white light, yellow light, etc. For instance, in some other embodiments of the present disclosure, a portion of film layers (such as the hole injection layer, the hole transport layer, the organic light-emitting layer, etc.) of the light-emitting functional layer may be respectively arranged in an array, and other portion of film layers (such as the electron transport layer, the electron injection layer, etc.) may be respectively an integral film layer.

For instance, in some embodiments of the present disclosure, the first electrode used for forming the liquid crystal lens is arranged in the same layer with one of the anode layer and the cathode layer of the light-emitting element layer. For instance, in some embodiments of the present disclosure, the light-emitting mode of the display substrate is top-emission; the anode layer of the light-emitting element layer is a reflective electrode layer; and the cathode layer is a transparent electrode layer. In this case, the first electrode and the cathode layer of the light-emitting element layer may be formed by the same material in the same layer, so the light transmittance of the first region of the display panel is high. For instance, in some other embodiments of the present disclosure, the light-emitting mode of the display substrate is bottom-emission; the anode layer of the light-emitting element layer is a transparent electrode layer; and the cathode layer is a reflective electrode layer. In this case, the first electrode and the anode layer of the light-emitting element layer may be formed by the same material in the same layer, so the light transmittance of the first region of the display panel is high. For instance, in some other embodiments of the present disclosure, when one of the anode layer and the cathode layer is a reflective electrode layer, the first electrode and the reflective electrode layer may be in the same layer and made from the same material. For instance, the first electrode may be set to include a plurality of first sub-electrodes arranged to be spaced away from each other as shown in FIG. 2C, so ambient light from the outside can transmit through the first electrode through a gap of adjacent first sub-electrodes. In the embodiment of the present disclosure, "A and B are arranged in the same layer" indicates that A and B are formed by the same film through patterning process, so A and B are arranged in the same layer and made from the same material.

For instance, in some other embodiments of the present disclosure, the first electrode and an electrode layer in the driving circuit layer are arranged in the same layer. For instance, the driving circuit includes a capacitor, a thin-film transistor and signal lines such as a gate line, a data line, a power line, etc. The first electrode may be formed in the same layer and made from the same material with the above signal lines, a capacitor electrode or a gate electrode, a source/drain electrode and the like in the thin-film transistor. For instance, a material of the first electrode may include a transparent conductive material and may also include a non-transparent conductive material. When the material of the first electrode includes the non-transparent conductive material, the first electrode may be set to include a plurality of first sub-electrodes arranged to be spaced away from each other as shown in FIG. 2C, so ambient light from the outside can run through the first electrode through a gap of the first sub-electrodes.

For instance, the display array layer is arranged around the recessed portion, and the first electrode is insulated from the anode layer and the cathode layer.

In at least one embodiment of the present disclosure, a type of the opposing substrate is not limited and may be selected as required. For instance, in some embodiments of the present disclosure, the opposing substrate may be only taken as a packaging cover plate to protect the display panel.

For instance, in some other embodiments of the present disclosure, the opposing substrate may be a color filter (CF) substrate. When the display substrate adopts top-emission, external ambient light may be filtered to reduce the interference of ambient light on a display image. Moreover, when the light-emitting element layer of the display substrate emits light of one color, the color filter substrate may be utilized to generate a color image. For instance, the light-emitting element layer emits white light, and a color filter layer of the color filter substrate may include a plurality of color filters of different colors. For instance, the light-emitting element layer emits blue light; the color filter layer of the color filter substrate may include quantum dots of different types; and different quantum dots can generate light of different colors under the excitation of the blue light.

For instance, in the display panel provided by some other embodiments of the present disclosure, the opposing substrate is set to be a touch substrate, so the display panel has touch function.

Description will be given below to the technical solution in at least one embodiment of the present disclosure by taking the case that the opposing substrate of the display substrate is a touch substrate as an example.

For instance, in the display panel provided by at least one embodiment of the present disclosure, the touch substrate includes a touch electrode layer disposed in the display region outside the first region. Illustratively, as shown in FIG. 3, the touch electrode layer 210 is disposed in the display region 210. For instance, the touch electrode layer may include one or more electrode layers; and one second electrode of the liquid crystal control electrode may be arranged in the same layer and made from the same material with one electrode layer of the touch electrode layer. Thus, the arrangement of the second electrode of the liquid crystal control electrode and one electrode layer of the touch electrode layer in the same layer will not increase steps of the manufacturing process of the touch substrate (opposing substrate), so the manufacturing process is simplified and the cost is reduced.

The touch substrate may be of multiple types such as a resistance type or a capacitance type. The capacitance type touch electrode layer may include a plurality of touch units, and the touch unit may be a capacitive touch unit and may be a self-capacitance type or mutual-capacitance type touch unit. Taking the case that the touch unit is a mutual-capacitance type touch unit as an example, the touch electrode layer includes a plurality of driving electrodes and a plurality of sensing electrodes; and the driving electrode and the sensing electrode are respectively extended along different directions (for example, the extension directions of the driving electrode and the sensing electrode are perpendicular to each other), so the driving electrode and the sensing electrode are intersected with and insulated from each other and provide a detecting capacitor at an intersected position. For instance, at least one of the driving electrode or the sensing electrode is arranged in the same layer with the second electrode.

For instance, the driving electrode and the sensing electrode are arranged in the same layer. In the process of forming the touch electrode layer, the same conductive layer is patterned to obtain segmented driving electrodes and a continuous sensing electrode, and subsequently, a connecting electrode for connecting the segmented driving electrodes is manufactured in another layer, so the manufacturing process is simplified and a thickness is reduced. For instance, in the process of forming the driving electrode and the sensing electrode by using patterning or forming the connecting electrode by using patterning, the second electrode is manufactured synchronously. Or the driving electrode and the sensing electrode are arranged in different layers; different conductive layers are patterned to respectively obtain a continuous driving electrode and a continuous sensing electrode; and an insulating layer is formed between different conductive layers and in the process of manufacturing a pressure touch panel, the driving electrode and the sensing electrode can be intersected with and insulated from each other without other auxiliary structures (such as a connecting electrode for bridge connection), so the manufacturing process is simplified. For instance, in the process of forming the driving electrode or the sensing electrode by patterning, the second electrode is synchronously manufactured.

For instance, in at least one embodiment of the present disclosure, when the opposing substrate is a touch substrate, the second electrode of the liquid crystal control electrode may also be independently arranged and does not need to be arranged in the same layer with the electrode layer of the touch electrode layer such as the driving electrode and the sensing electrode. In this case, the touch electrode layer and the second electrode may be arranged on the same side of the touch substrate and may also be arranged on two opposite sides of the touch substrate.

For instance, in at least one embodiment of the present disclosure, the touch electrode layer and the second electrode of the liquid crystal control electrode may be disposed on a side of the touch substrate (the opposing substrate) away from the display substrate as shown in FIG. 3, or the touch electrode layer and the second electrode of the liquid crystal control electrode may be disposed on a side of the touch substrate (the opposing substrate) facing the display substrate.

For instance, in the display panel provided by at least one embodiment of the present disclosure, the display substrate may further include a packaging layer which covers the display region and the first region. For instance, in the recessed portion, the packaging layer covers a side wall and a bottom of the recessed portion, and the liquid crystal layer is disposed between the packaging layer and the opposing substrate in the recessed portion. Illustratively, as shown in FIG. 3, the display substrate includes a packaging layer 120 covering the display region 101 and the first region 102. Thus, the packaging layer 120 may encapsulate an element (such as the display array layer 110) of the display substrate and may also encapsulate the liquid crystal layer 300, so as to avoid the intrusion of harmful substances into the liquid crystal layer 300 or avoid the intrusion of liquid crystal of the liquid crystal layer 300 into the display substrate, thereby ensuring the packaging yield of the display panel.

For instance, in the display panel provided by at least one embodiment of the present disclosure, the packaging layer includes at least one inorganic packaging layer and an organic packaging layer which are laminated to each other. The inorganic packaging layer has high compactness and then can effectively block the intrusion of external water, oxygen and the like, and the organic packaging layer has larger thickness and certain flexibility, may also planarize the surface of the display substrate, is used for buffering stress, facilitates the cell-assembling of the display substrate and the opposing substrate, and may also be filled with a material such as a drying agent to absorb the intruded water, oxygen and the like, so as to protect an element in the display panel.

For instance, in some embodiments of the present disclosure, both the organic packaging layer and the inorganic packaging layer of the packaging layer cover the display region and the first region of the display substrate. Illustratively, as shown in FIG. 3, the inorganic packaging layer 120 includes a first inorganic packaging layer 121, an organic packaging layer 122 and a second inorganic packaging layer 123 which are sequentially laminated to each other. The first inorganic packaging layer 121, the organic packaging layer 122 and the second inorganic packaging layer 123 all cover the display region 101 and the first region 102.

For instance, in some other embodiments of the present disclosure, the organic packaging layer of the packaging layer covers the display region and exposes the first region, and at least one inorganic packaging layer of the packaging layer covers the display region and the first region. A thickness of the organic packaging layer is larger, and the organic packaging layer is disposed in the display region outside the first region, so that the recessed portion for accommodating the liquid crystal layer has great depth, and then the liquid crystal layer has large design thickness. The inorganic packaging layer covers the first region, so the packaging layer can still encapsulate the liquid crystal layer, so as to ensure the packaging yield of the display panel.

Figure 4:
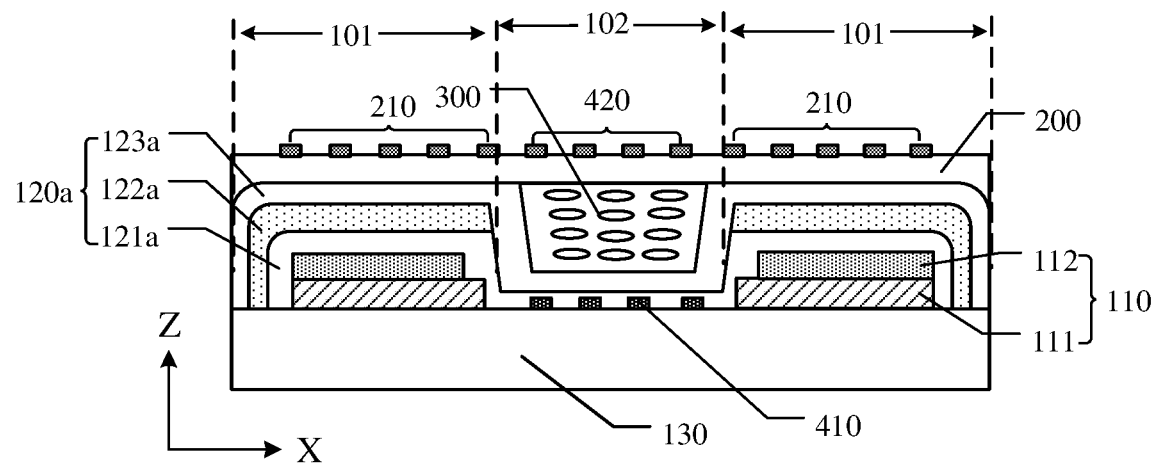
FIG. 4 is a sectional view of another display panel provided by some embodiments of the present disclosure.

For instance, in the display panel provided by at least one embodiment of the present disclosure, the packaging layer includes two inorganic packaging layers and one organic packaging layer which are laminated to each other; the organic packaging layer is disposed between the two inorganic packaging layers and covers the display region and exposes the first region; the two inorganic packaging layers cover the display region; and at least one of the two inorganic packaging layers covers the first region. Illustratively, as shown in FIG. 4, an inorganic packaging layer 120a includes a first inorganic packaging layer 121a, an organic packaging layer 122a and a second inorganic packaging layer 123a which are sequentially laminated to each other on the display array layer 110. Both the first inorganic packaging layer 121a and the second inorganic packaging layer 123a cover the display region 101 and the first region 102, and the organic packaging layer 122a is disposed in the display region 101 on the outside of the first region 102.

For instance, in some embodiments, in the process of forming the packaging layer, after the organic packaging layer is formed on the display substrate, a portion of the organic packaging layer disposed in the first region is patterned (such as etching) to remove at least partial organic packaging layer in the first region, and subsequently, the inorganic packaging layer may be deposited on the organic packaging layer. In this way, the packaging layer disposed in the first region is provided with a recessed portion to accommodate the liquid crystal layer. For instance, in some other embodiments, after an organic packaging material film layer is deposited on the display substrate, before the organic packaging material film layer is cured, a groove is formed in a portion of the organic packaging material film layer disposed in the first region by an imprinting process, and subsequently, the organic packaging material film layer is cured to form the organic packaging layer; and after the inorganic packaging layer is deposited on the organic packaging layer, the packaging layer disposed in the first region is provided with a recessed portion corresponding to the groove to accommodate the liquid crystal layer. The mode of thinning or removing the organic packaging layer in the first region is not limited to the above method and may be selected according to specific processes.

For instance, in at least one embodiment of the present disclosure, an average thickness of the organic packaging layer in the display region may be 5 to 15 μm, for example, may be 8 µm, 10 µm, 12 µm, etc. For instance, the organic packaging layer may be thickened as needed, not limited to the above numerical range.

For instance, in some embodiments of the present disclosure, as shown in FIG. 5, an adhesive layer 600 is disposed between the display substrate and the opposing substrate 200 and may bond the display substrate and the opposing substrate 200. For instance, the adhesive layer 600 is disposed in the display region 101 outside the first region 102, so as to increase a spacing between surfaces of the display substrate and the opposing substrate in the first region, and increase a design thickness of the liquid crystal layer. For instance, as shown in FIG. 5, when an alignment layer (a first alignment layer 510) is disposed on the opposing substrate, an orthographic projection of the adhesive layer 600 on the opposing substrate 200 is disposed outside an orthographic projection of the first alignment layer 510 on the opposing substrate 200. For instance, a material of the adhesive layer 600 may be an optically clear adhesive (OCA).

For instance, a thickness of the adhesive layer may be 2 to 10 µm, for example, may be 4 µm, 6 µm, 8 µm, etc.

Figure 6:
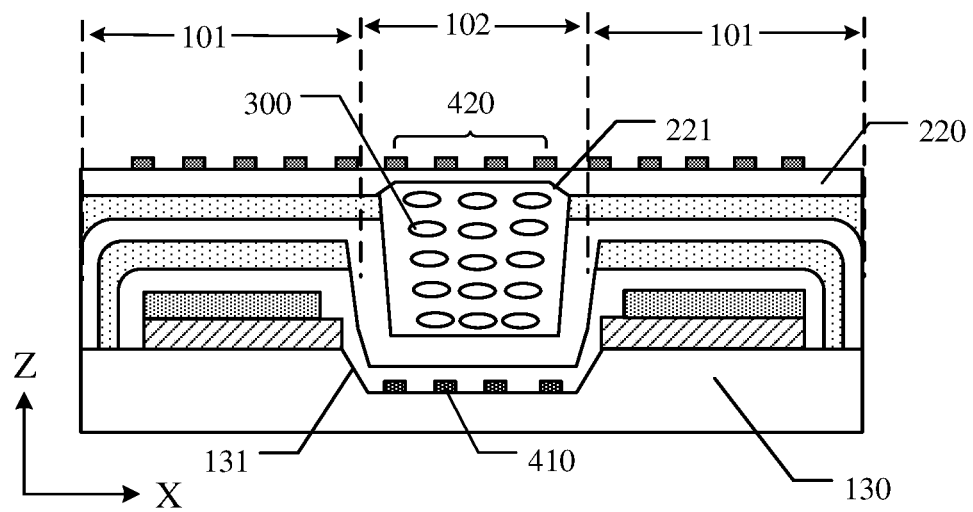
FIG. 6 is a sectional view of another display panel provided by some embodiments of the present disclosure.

For instance, in the display panel provided by at least one embodiment of the present disclosure, the display substrate includes a first base substrate, and the first base substrate includes a first groove in the first region on a surface facing the opposing substrate; and/or the opposing substrate includes a second base substrate, and the second base substrate includes a second groove in the first region on a surface facing the display substrate. Illustratively, as shown in FIG. 6, the display substrate includes a first base substrate 130, and the display array layer of the display substrate, the packaging layer and the first electrode of the liquid crystal control electrode are all disposed on the first base substrate 130. The opposing substrate includes a second base substrate 220, and the second electrode 420 of the liquid crystal control electrode, the touch electrode layer and the like are disposed on the second base substrate 220. In the first region 102, a first groove 131 is formed on a surface of the first base substrate 130 facing the opposing substrate, and a second groove 221 is formed on a surface of the second base substrate 220 facing the display substrate. The first groove 131 and the second groove 221 can increase the spacing between the surfaces of the display substrate and the opposing substrate in the first region 102, so as to increase the design thickness of the liquid crystal layer 300.

For instance, the first base substrate 130 and the second base substrate 220 are glass substrates. For instance, the first groove may be formed on the first base substrate and/or the second groove may be formed on the second base substrate by etching, chemical mechanical grinding and the like, and meanwhile, the first base substrate and the second base substrate have flat surfaces. The first base substrate 130 and the second base substrate 220 may also be plastic substrates. For instance, the first groove may be formed on the first base substrate and/or the second groove may be formed on the second base substrate by mould pressing. Wherein, the first groove and/or the second groove may correspond to the recessed portion.

For instance, the base substrates of the display substrate and the opposing substrate may be composed of a plurality of film layers. In the process of manufacturing the base substrates, a portion among the plurality of film layers may be patterned to form a groove. For instance, the first base substrate of the display substrate includes a first film layer, a second film layer, a third film layer and a fourth film layer which are sequentially laminated to each other. For instance, the third film layer and the fourth film layer are patterned to remove a portion of the third film layer and the fourth film layer disposed in the first region, so as to form the first groove, disposed in the first region, on the first base substrate.

At least one embodiment of the present disclosure provides a display device, which comprises the display panel provided by any forgoing embodiment. For instance, the display panel is an organic light-emitting diode (OLED) display panel. For instance, the OLED display panel is a flexible OLED display panel.

Figure 7:
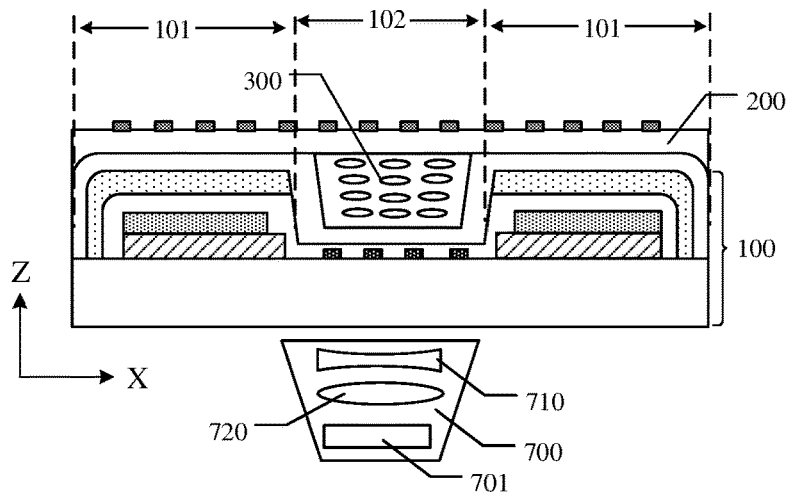
FIG. 7 is a sectional view of a display device provided by some embodiments of the present disclosure.

For instance, the display device provided by at least one embodiment of the present disclosure may further comprise an image capture element which is disposed on a side of the display substrate away from the opposing substrate (namely the back). For instance, the image capture element is fixed on the back of the display substrate by double-faced adhesive tape or other means. The image capture element and the first region of the display substrate are overlapped with each other in a direction perpendicular to the display panel, so as to receive ambient light incident through the first region of the display substrate, and sense the ambient light for imaging. For instance, the image capture element includes an image sensor (manufactured into an IC chip). The image sensor, for instance, adopts complementary metal oxide semiconductor (CMOS) type or charge-coupled device (CCD) type, and for instance, includes an imaging subpixel array arranged in an array. The type and the structure of the image capture element are not limited in the embodiment of the present disclosure. Illustratively, as shown in FIG. 7, the light-emission mode of the display substrate 100 is top-emission, and the image capture element 700 is disposed on a side of the display substrate 100 away from the opposing substrate 200. For instance, in some embodiments, the light-emission mode of the display substrate is bottom-emission, and a side of the display substrate away from the opposing substrate is a display side of the display panel. Thus, the image capture element may be disposed on a side of the opposing substrate away from the display substrate.

For instance, in the display device provided by at least one embodiment of the present disclosure, the image capture element may further include a first lens. Illustratively, as shown in FIG. 7, the image capture element 700 includes a first lens 710. For instance, the first lens may be a concave lens as shown in FIG. 7 and may also be a convex lens. For instance, the image capture element 700 includes an image sensor 701, and the first lens 710 is disposed in front of the image sensor 701, namely incident ambient light is incident into the image sensor for imaging after modulated by the first lens 710.

For instance, in the display device provided by at least one embodiment of the present disclosure, the image capture element further includes a second lens; the first lens is disposed between the second lens and the display substrate; and the first lens is set to be a concave lens, and the second lens is set to be a convex lens. Illustratively, as shown in FIG. 7, the image capture element 700 includes a first lens 710 and a second lens 720, and the first lens 710 is disposed between the display panel and the second lens 720. When the liquid crystal layer 300 is formed as a liquid crystal lens (equivalent to a convex lens), the liquid crystal lens 300, the first lens 710 and the second lens 720 form a zoom component of the image capture element 700. For instance, the first lens 710 and the second lens 720 are disposed in front of the image sensor 701, namely incident ambient light is incident into the image sensor 701 for imaging after modulated by the first lens 710 and the second lens 720.

For instance, in the embodiment of the present disclosure, the focal length of the liquid crystal lens 300 may be adjusted by controlling the electric field generated by the liquid crystal control electrode. Thus, the requirement on the moving space of the first lens 710 (concave lens) can be reduced, or the first lens 710 is set to do not need to move, thereby reducing the design dimension of the image capture element 700 and facilitating the thinning design of the display device.

For instance, in at least one embodiment of the present disclosure, when the thickness of the liquid crystal layer is large enough (for example, more than 50 µm), the image capture element may be not required to be provided with other zoom components such as the first lens and the second lens, which can simplify the structure of the image capture element and facilitate the thinning design of the display device.

For instance, the display device provided by at least one embodiment of the present disclosure may be a product or a component with display function such as a TV, a digital camera, a mobile phone, a watch, a tablet PC, a notebook computer or a navigator.

In the display panel and the display device provided by at least one embodiment of the present disclosure, the liquid crystal lens may act as an optical lens, so the optical lens is disposed in the display panel without forming an opening on the display panel, which ensures the packaging and display effects of the display panel and simplifies the structure of the display panel and the display device.

It should be noted that, for clarity, the present disclosure does not present the entire structure of the display device provided by at least one embodiment. In order to realize the necessary functions of the display device, those skilled in the art may arrange other structures according to specific application scenes, which is not limited in the embodiments of the present disclosure.

At least one embodiment of the present disclosure provides a method for manufacturing a display panel, which comprises: providing a display substrate, in which the display substrate includes a display region and a first region disposed in the display region, and is provided with a recessed portion disposed in the first region; injecting liquid crystal material into the recessed portion; providing an opposing substrate, and cell-assembling the opposing substrate and the display substrate so that the liquid crystal material is formed into a liquid crystal layer; and forming a liquid crystal control electrode on at least one of the display substrate and the opposing substrate, in which the liquid crystal control electrode is configured to allow the liquid crystal layer to form a liquid crystal lens after applied with voltage.

The structure of the display panel obtained by the above manufacturing method may refer to relevant description in the above embodiments, and no further description will be given here.

Figure 8:
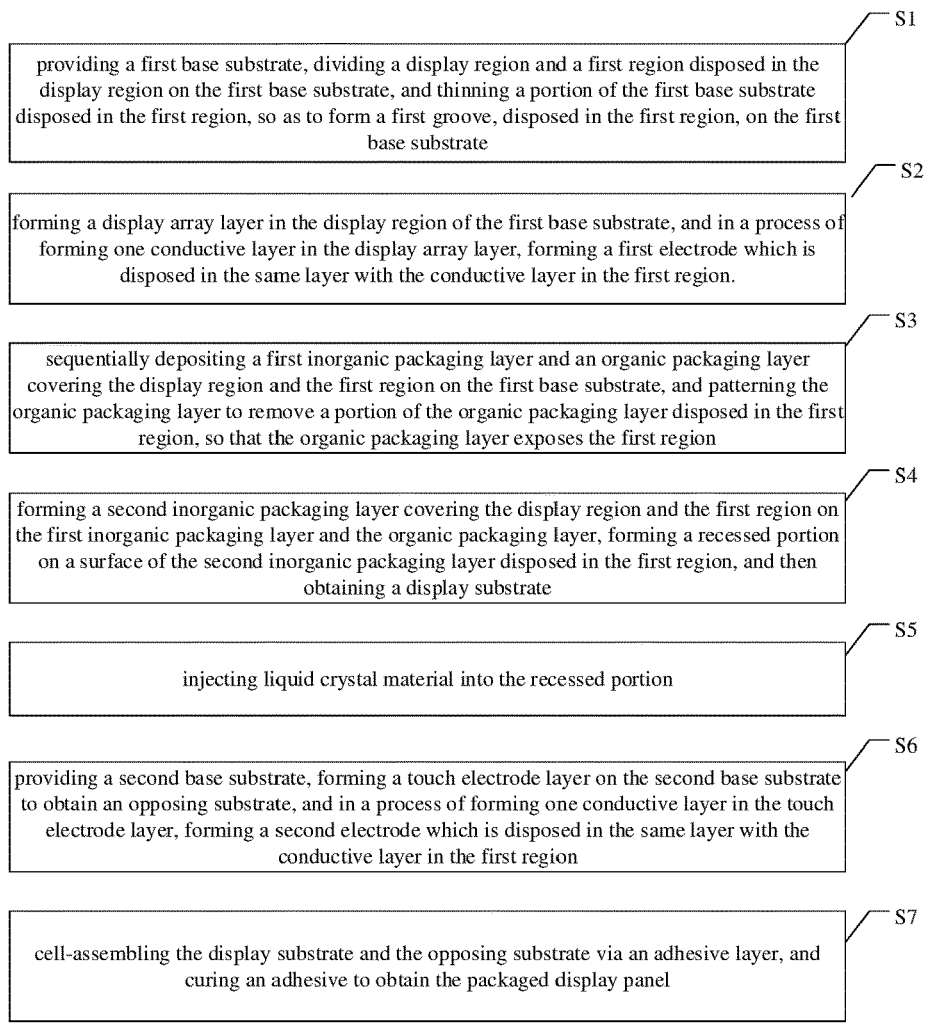
FIG. 8 is a flowchart of a method for manufacturing a display panel provided by some embodiments of the present disclosure.

For instance, in some embodiments of the present disclosure, as shown in FIG. 8, the manufacturing method of the display panel may comprise the following processes.

S1: providing a first base substrate, dividing a display region and a first region disposed in the display region on the first base substrate, and thinning a portion of the first base substrate disposed in the first region, so as to form a first groove, disposed in the first region, on the first base substrate.

S2: forming a display array layer in the display region of the first base substrate, and in a process of forming one conductive layer in the display array layer, forming a first electrode which is disposed in the same layer with the conductive layer in the first region. For instance, a driving circuit layer is formed on the first base substrate, and a light-emitting element layer is formed on the driving circuit layer. The forming of the driving circuit layer may include a relevant process of manufacturing a thin-film transistor, and no further description will be given here.

S3: sequentially depositing a first inorganic packaging layer and an organic packaging layer covering the display region and the first region on the first base substrate, and patterning the organic packaging layer to remove a portion of the organic packaging layer disposed in the first region, so that the organic packaging layer exposes the first region.

S4: forming a second inorganic packaging layer covering the display region and the first region on the first inorganic packaging layer and the organic packaging layer, forming a recessed portion on a surface of the second inorganic packaging layer disposed in the first region, and then obtaining a display substrate.

S5: injecting liquid crystal material into the recessed portion.

S6: providing a second base substrate, forming a touch electrode layer on the second base substrate to obtain an opposing substrate, and in a process of forming one conductive layer in the touch electrode layer, forming a second electrode which is disposed in the same layer with the conductive layer in the first region.

S7: cell-assembling the display substrate and the opposing substrate via an adhesive layer, and curing an adhesive to obtain the packaged display panel.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined to obtain a new embodiment.

What are described above is related to the specific embodiments of the disclosure only and not limitative to the scope of the disclosure. The protection scope of the disclosure shall be based on the protection scope of the claims.

The application claims priority to the Chinese patent application No. 201910142304.4, filed Feb. 26, 2019, the disclosure of which is incorporated herein by reference as part of the application.

The invention claimed is:

1. A display panel, comprising:
    a display substrate and an opposing substrate arranged opposite to each other, in which the display substrate includes a display region and a first region disposed in the display region, and the display substrate is provided with a recessed portion in the first region on a side facing the opposing substrate;
    a liquid crystal layer, accommodated into the recessed portion and disposed between the display substrate and the opposing substrate; and
    a liquid crystal control electrode, configured to allow the liquid crystal layer to form as a liquid crystal lens after being applied with a voltage,
    wherein the liquid crystal control electrode includes a first electrode disposed on the display substrate and a second electrode disposed on the opposing substrate, and the first electrode and the second electrode are overlapped with the liquid crystal layer in a direction perpendicular to the display panel, wherein the display substrate includes a display array layer in the display region on the side facing the opposite substrate, the display array layer includes a plurality of conductive layers, and the first electrode is arranged in a same layer with one of the plurality of conductive layers.

2. The display panel according to claim 1, wherein the first electrode includes a plurality of annular first sub-electrodes, the second electrode includes a plurality of annular second sub-electrodes, and the plurality of annular first sub-electrodes are disposed to be spaced away from each other and the plurality of annular second sub-electrodes are disposed to be spaced away from each other along a radial direction of the liquid crystal layer.

3. The display panel according to claim 1, wherein one of the first electrode and the second electrode is set to include a plurality of annular sub-electrodes, and the plurality of annular sub-electrodes are disposed to be spaced away from each other along a radial direction of the liquid crystal layer; and another one of the first electrode and the second electrode is set to be a planar electrode.

4. The display panel according to claim 1, wherein the display array layer is arranged around the recessed portion, and the first electrode is insulated from the plurality of conductive layers of the display array layer.

5. The display panel according to claim 1, wherein the display array layer includes a driving circuit layer and a light-emitting element layer disposed on the driving circuit layer, the driving circuit layer is configured to control a light-emitting element of the light-emitting element layer to emit light, the light-emitting element layer includes an anode layer, a light-emitting functional layer, and a cathode layer which are laminated to each other; and the first electrode is arranged in a same layer with one of the anode layer and the cathode layer.

6. The display panel according to claim 5, wherein the display array layer is arranged around the recessed portion, and the first electrode is insulated from the anode layer and the cathode layer.

7. The display panel according to claim 1, wherein the opposing substrate is set to be a touch substrate.

8. The display panel according to claim 7, wherein the touch substrate includes a touch electrode layer disposed in the display region outside the first region, the touch electrode layer includes a plurality of driving electrodes and a plurality of sensing electrodes, the plurality of driving electrodes and the plurality of sensing electrodes are intersected with each other, and the second electrode is arranged in a same layer with at least one of the driving electrodes or the sensing electrodes.

9. The display panel according to claim 1, wherein the display substrate also includes a packaging layer covering the display region and the first region, and the liquid crystal layer is disposed between the packaging layer and the opposing substrate.

10. The display panel according to claim 9, wherein the packaging layer includes at least one inorganic packaging layer and an organic packaging layer laminated to each other, the organic packaging layer covers the display region and is not disposed in the first region, and the at least one inorganic packaging layer covers the display region and the first region.

11. The display panel according to claim 10, wherein the at least one inorganic packaging layer covers a side wall and a bottom of the recessed portion, so as to surround the liquid crystal layer.

12. The display panel according to claim 9, wherein the packaging layer includes two inorganic packaging layers and one organic packaging layer laminated to each other, the organic packaging layer is disposed between the two inorganic packaging layers, the organic packaging layer covers the display region and is not disposed in the first region, the two inorganic packaging layer covers the display region, and at least one of the two inorganic packaging layers covers the first region.

13. The display panel according to claim 1, wherein the display substrate includes a first base substrate, and the first base substrate includes a first groove in the first region on a surface facing the opposing substrate; and/or the opposing substrate includes a second base substrate, and the second base substrate includes a second groove in the first region on a surface facing the display substrate, in which the first groove and the second groove correspond to the recessed portion.

14. A display device, comprising the display panel according to claim 1.

15. The display device according to claim 14, further comprising:

an image capture element, disposed on a side of the display panel opposite to a display side, wherein the image capture element is overlapped with the first region of the display substrate in the direction perpendicular to the display panel, so as to receive ambient light incident through the first region of the display substrate.

16. The display device according to claim 15, wherein the image capture element includes a first lens.

17. The display device according to claim 16, wherein the image capture element also includes a second lens, the first lens is disposed between the second lens and the display substrate, and the first lens is configured to be a concave lens, and the second lens is configured to be a convex lens.

18. A method for manufacturing a display panel, wherein the display panel is the display panel according to claim 1, the method comprising:

providing the display substrate, in which the display substrate includes the display region and the first region disposed in the display region, the display substrate is provided with the recessed portion disposed in the first region;

injecting a liquid crystal material into the recessed portion;

providing the opposing substrate and cell-assembling the opposing substrate and the display substrate so that the liquid crystal material is formed into the liquid crystal layer; and forming the liquid crystal control electrode on at least one of the display substrate or the opposing substrate, in which the liquid crystal control electrode is configured to allow the liquid crystal layer to form the liquid crystal lens after being applied with the voltage.

19. A display panel, comprising:

a display substrate and an opposing substrate arranged opposite to each other, in which the display substrate includes a display region and a first region disposed in the display region, and the display substrate is provided with a recessed portion in the first region on a side facing the opposing substrate;

a liquid crystal layer, accommodated into the recessed portion and disposed between the display substrate and the opposing substrate; and a liquid crystal control electrode, configured to allow the liquid crystal layer to form as a liquid crystal lens after being applied with a voltage, wherein the display substrate includes a first base substrate, and the first base substrate includes a first groove in the first region on a surface facing the opposing substrate; and/or the opposing substrate includes a second base substrate, and the second base substrate includes a second groove in the first region on a surface facing the display substrate, in which the first groove and the second groove correspond to the recessed portion.

* * * * *